(12) United States Patent
Hiller et al.

(10) Patent No.: US 7,119,344 B2
(45) Date of Patent: Oct. 10, 2006

(54) ELECTRON BEAM DEVICE HAVING A SPECIMEN HOLDER

(75) Inventors: Stephan Hiller, Aalen (DE); Richard König, Rot am See (DE); Harald Niebel, Oberkochen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 24 days.

(21) Appl. No.: 10/895,629

(22) Filed: Jul. 21, 2004

(65) Prior Publication Data

US 2005/0199810 A1 Sep. 15, 2005

(30) Foreign Application Priority Data

Jul. 31, 2003 (DE) ................. 103 35 504

(51) Int. Cl.
*H01J 37/20* (2006.01)
(52) U.S. Cl. ............... 250/442.11; 250/440.11; 250/311
(58) Field of Classification Search ........... 250/442.11, 250/311, 440.11
See application file for complete search history.

(56) References Cited

U.S. PATENT DOCUMENTS

| | | | | |
|---|---|---|---|---|
| 4,139,243 A | * | 2/1979 | Landsman | .................. 384/114 |
| 4,720,907 A | | 1/1988 | Rapp | |
| 5,481,111 A | * | 1/1996 | Rosar et al. | ................. 250/311 |
| 5,892,458 A | | 4/1999 | Anderer et al. | |
| 6,092,722 A | | 7/2000 | Heinrichs et al. | |
| 6,170,748 B1 | * | 1/2001 | Hash et al. | .................. 235/451 |
| 6,531,698 B1 | | 3/2003 | Benner | |
| 6,646,238 B1 | | 11/2003 | Fuhr et al. | |

FOREIGN PATENT DOCUMENTS

| | | |
|---|---|---|
| DE | 35 41 676 A1 | 5/1987 |
| DE | 39 20 050 A1 | 1/1991 |
| DE | 91 01 033 U1 | 8/1991 |
| DE | 295 16 766 U1 | 11/1996 |
| DE | 195 40 527 A1 | 5/1997 |
| DE | 196 31 425 A1 | 2/1998 |
| DE | 196 29 646 C2 | 9/1998 |
| DE | 295 22 076 U1 | 10/1999 |

(Continued)

OTHER PUBLICATIONS

Euchner GmbH + Co. webpage (www.euchner.de) printout regarding Identsystem CIS3A Mini in German language and English language.

(Continued)

*Primary Examiner*—Kiet T. Nguyen
(74) *Attorney, Agent, or Firm*—Muirhead & Saturnelli, LLC

(57) ABSTRACT

An electron beam device having a specimen holder, in particular for a transmission electron microscope (TEM), which makes it possible to identify the specimen holder in a simple manner is described. Therefore, the electron beam device has at least one specimen holder having at least one holding element for holding a specimen and at least one identification unit. Furthermore, the electron beam device has a reading unit for reading the identification unit without contact, a goniometer, into which the specimen holder may be inserted, and a controller for controlling the movement modes of the goniometer, via which the movement modes of the goniometer are controlled on the basis of the identification data supplied by the identification unit and of corresponding data stored in the controller.

24 Claims, 2 Drawing Sheets

FOREIGN PATENT DOCUMENTS

| | | |
|---|---|---|
| DE | 199 45 344 A1 | 3/2001 |
| DE | 43 01 401 C2 | 10/2002 |
| EP | 0 510 618 A1 | 10/1992 |
| JP | 2002-216693 A | 8/2002 |
| WO | WO 89/01698 | 2/1989 |
| WO | WO 00/68663 | 11/2000 |

OTHER PUBLICATIONS

English language brochure (pp. 1-19) regarding Identsystem CIS3/CIS3A provided by Euchner GmbH + Co. on its webpage www.euchner.de.

Machine translation of JP 2002-216693 A (Reference AG).

* cited by examiner

ELECTRON BEAM DEVICE HAVING A SPECIMEN HOLDER

BACKGROUND OF THE INVENTION

1. Technical Field

The present invention relates to an electron beam device having a specimen holder, in particular a transmission electron microscope (TEM).

2. Description of Related Art

Specimen holders which are used in electron beam devices have for long had a tiltable design. Tilting a specimen to be examined is advantageous in different examination methods used in the case of an electron beam device. A goniometer is typically used for angle adjustment. However, specimen holders from different manufacturers have different maximum tilt angles. Because different specimen holders are used in electron beam devices depending on the specimen to be examined and the examination method used, the movements of the goniometer are a function of a specimen holder used in an electron beam device. In particular, the tilt angle of certain specimen holders is limited as a function of the objective lens of the electron beam device and of the movement axis set by a user.

To identify different specimen holders, the method of mounting contacts on the specimen holder for holder indexing, which are brought into contact with contacts of a plug connector, is known to date. The specimen holder is identified via the indexing. It is, however, disadvantageous here that the plug-in connector must always be plugged in. Furthermore, it is disadvantageous that users often use specimen holders from different manufacturers. One problem is that the manufacturers of the individual specimen holders must agree on a single indexing system; otherwise errors in the assignment and identification of the individual specimen holders and thus in the adjustment of the tilt angle may occur when reading the indexing. Another problem is that the design and performance of some electron beam devices are only suited for receiving specimen holders from a single manufacturer to ensure sufficiently good functioning and regular operation of the electron beam device.

Alternatively, a method is known in which data belonging to a sample holder must be queried by the control software of the electron beam device or a goniometer mounted thereon when changing the sample holder and accordingly must be input by the user. Incorrect inputs entailing serious consequences for the sample holder and/or the objective lens are thus possible.

It would be desirable to provide an electron beam device having a specimen holder which makes it possible to identify the specimen holder in a simple manner.

SUMMARY OF THE INVENTION

The electron beam device according to the invention, in particular a transmission electron microscope, comprises at least one specimen holder having at least one holding element for holding a specimen and at least one identification unit. Furthermore, the electron beam device has a reading unit for reading the identification unit without contact, a goniometer, into which the specimen holder may be inserted, and a controller for controlling the movement modes of the goniometer, via which the movement modes of the goniometer are controlled on the basis of the identification data supplied by the identification unit and of corresponding data stored in the controller. The specimen holder according to the present invention has the advantage that it does not require a plug-in connector. Changing the specimen holder is therefore very simple. The identification unit permits unique identification of the different designs of specimen holders. In particular, individual designs of individual manufacturers are clearly recognized. If a specimen holder which is not uniquely identifiable or belongs to a manufacturer whose specimen holder should not be used in the electron beam device is to be used, a control electronic system will not enable the specimen holder as well as the electron beam device for use or will enable them only with limitations.

Due to the simple identification, it is possible to adjust the movement modes of a goniometer, via which a determinable tilt angle of the specimen holder is set, according to the type of specimen holder and limit them if necessary.

The identification unit of the present invention may be active or passive. This means that the identification unit has (active) or does not have (passive) its own voltage supply. The latter design is particularly well suited, because it is implementable in a particularly simple manner.

Furthermore, the identification unit is preferably an optical and/or magnetic unit and may be read using an optical and/or magnetic reading unit. For example, the identification unit may be designed as a transponder. The transponder preferably has at least one high-frequency coil, which receives power in a known manner, which corresponds to an appropriate code (ID number). This code may be read using a reading unit, for example, which is designed as a receiving coil. The above embodiment is based on the principle of induction, which has been known for a long time.

As mentioned above, the identification unit may also be designed as an optical unit. A bar code, which may be recognized and read using an optical scanner, is preferably situated on the specimen holder. A laser scanner is particularly well suited for this purpose because of its compact design.

As mentioned previously, the specimen holder according to the present invention has at least one holding element for holding a specimen. This holding element is preferably situated on a handle which is used to hold the specimen holder. In order to make the holding element as compact as possible so that it takes up minimal space in the electron beam device, the identification unit is preferably situated on the handle.

Furthermore, an electronic analyzer system, which supplies the data read from the identification unit to a control unit of the electron beam device and/or the goniometer, is also assigned to the electron beam device. The reading unit is preferably situated in or on a goniometer, into which the specimen holder may be inserted.

The data stored in the controller comprise preferably data records specifying movement sequences (movement modes) of several different specimen holders, wherein each data record corresponds to a single specimen holder and is not modifiable. Therefore, a precise positioning of the specimen holder with the goniometer is possible after the unique identification of the specimen holder.

The above-described specimen holder is particularly well suited for a transmission electron microscope. However, the present invention is not limited to microscopes of this type. It is suitable for any particle beam device needing a specimen holder.

The present invention is described in the following on the basis of exemplary embodiments according to the following figures:

DETAILED DESCRIPTION OF VARIOUS EMBODIMENTS

Figure 1:
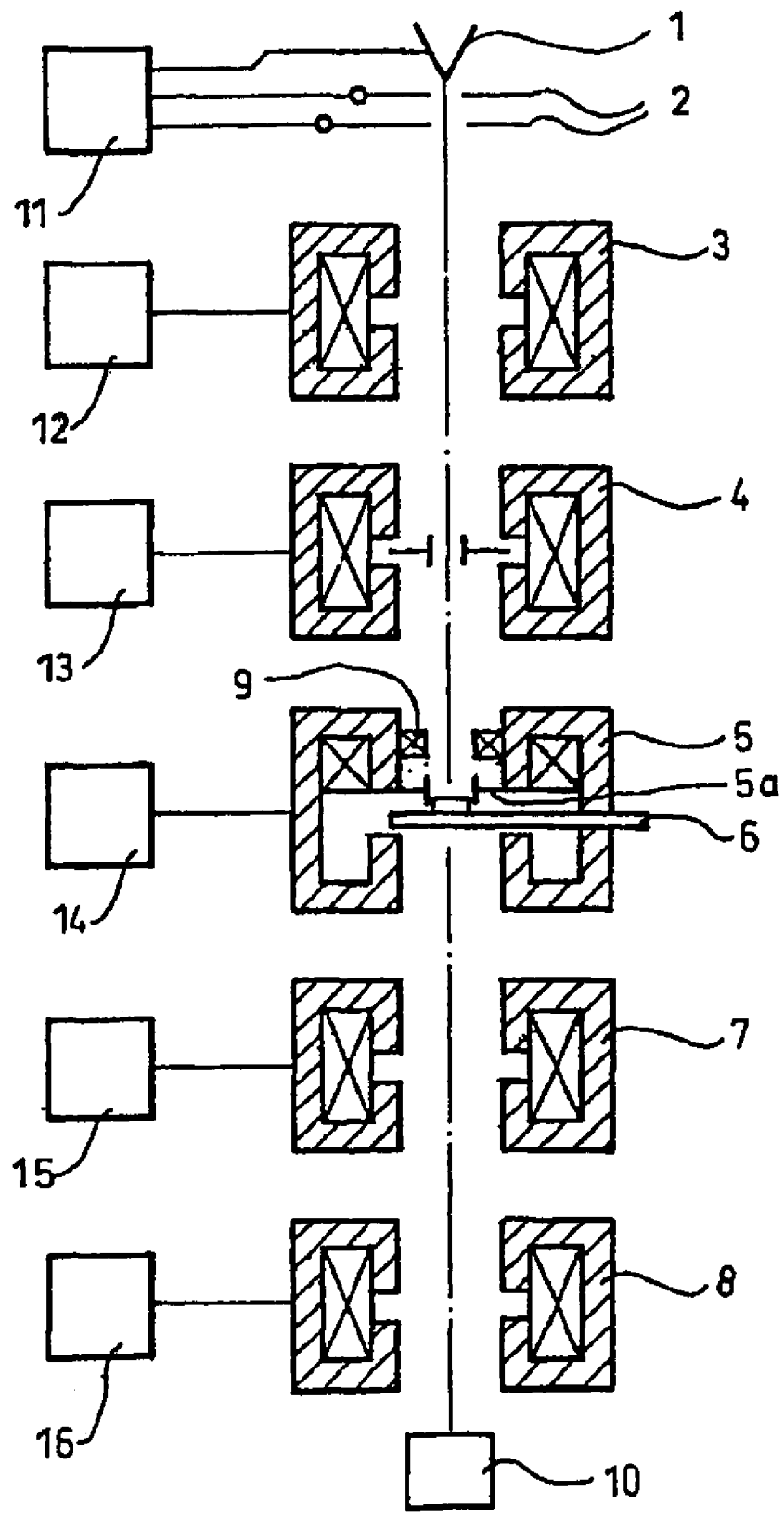
FIG. 1 shows a section along an optical axis through a transmission electron microscope.

FIG. 1 shows a schematic illustration of a transmission electron microscope according to the invention, which has the identification system of the present invention and the specimen holder of the present invention.

The transmission electron microscope (TEM) has an electron source 1 having a downstream acceleration stage 2, which accelerates the electrons exiting from electron source 1 (hereinafter referred to as primary electrons). A condenser system having two magnetic lenses 3, 4 is provided for further forming the primary electron beam exiting from electron source 1. A single-field condenser objective lens 5 and a forefield diaphragm 5a are connected downstream from the two condenser lenses 3, 4 as known, for example, from DE 199 45 344 A1. A specimen holder 6, which is angularly adjustable via a goniometer (not shown) and will be described in more detail in the following, is situated in single-field condenser objective lens 5. Furthermore, coils 9 which are used as a deflector system in a scanning (STEM) operation are provided.

A multistage system made up of magnetic lenses 7, 8, which are used for enlarged imaging of a specimen on a detector 10, is connected downstream from single-field condenser objective lens 5. Furthermore, FIG. 1 shows control and supply units 11 through 16 needed for supplying the individual electron-optical components.

Figure 2:
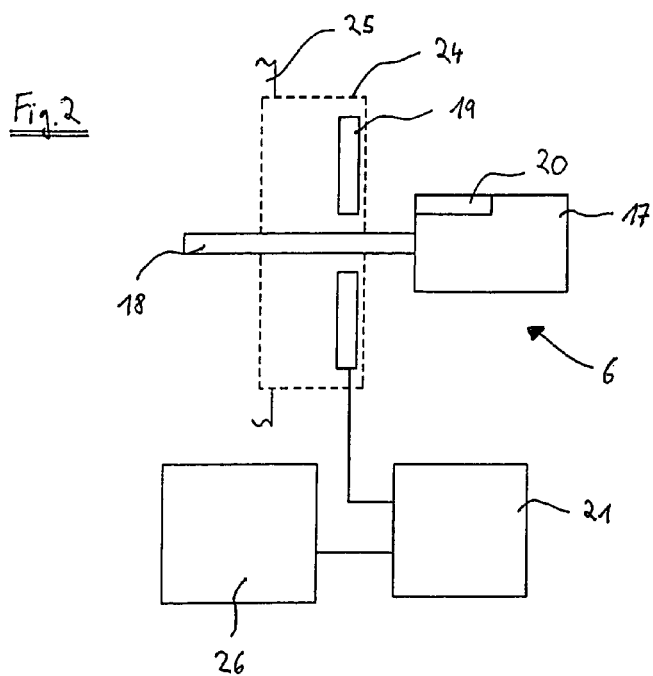
FIG. 2 shows a schematic illustration of an identification system having a specimen holder.

FIG. 2 shows a schematic illustration of the identification system for specimen holder 6, situated in the transmission electron microscope according to FIG. 1. Specimen holder 6 has a holding element 18, on which the specimen to be examined is situated. A handle 17 having a transponder 20 on one of its sides is situated downstream from holding element 18. Transponder 20 includes one or more high-frequency coil(s). Furthermore, transponder 20 receives a code (identification number) in the known manner, which permits specimen holder 6 to be uniquely identified.

As mentioned previously, a goniometer 24 is situated on the transmission electron microscope, whose column 25 is schematically shown in FIG. 2, an analyzer coil 19 connected to an electronic analyzer system 21 being situated on or in the goniometer 24. When specimen holder 6 is inserted into goniometer 24, an inductive coupling, which is analyzed by electronic analyzer system 21, is created as transponder 20 approaches coil 19. The code implemented in transponder 20 for identifying specimen holder 6 is thus obtained. On the basis of the analysis by electronic analyzer system 21 and possibly of other data which may be stored in a goniometer controller 26, the movement modes of goniometer 24 and thus of specimen holder 6 are controlled.

Figure 3:
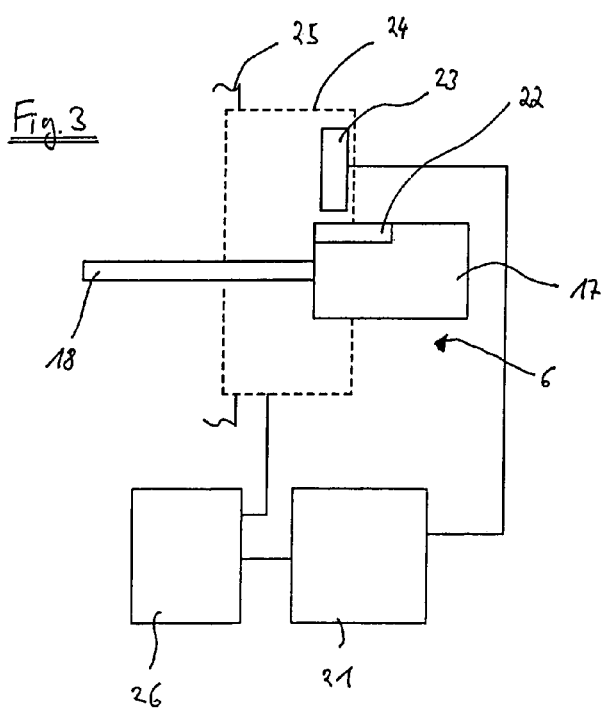
FIG. 3 shows a schematic illustration of another identification system having a specimen holder.
Figure 4:
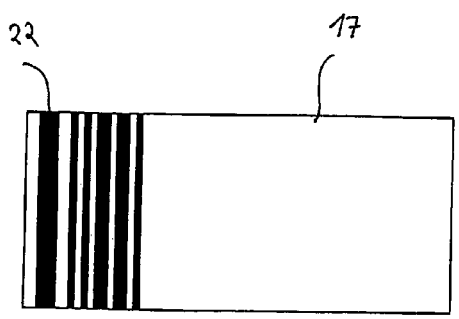
FIG. 4 shows a top view of a handle of the specimen holder of FIG. 3.

Another exemplary embodiment is schematically illustrated in FIG. 3. Identical components are labeled using identical reference symbols. Contrary to the exemplary embodiment illustrated in FIG. 2, a bar code 22, which may be read by a laser scanner 23, is situated on one side of handle 17. Specimen holder 6 is identified in this manner. Bar code 22 (as well as transponder 20) may be situated at any point of handle 17, i.e., specimen holder 6 (see also FIG. 4).

The specimen holder according to the present invention and the identification system according to the present invention have the advantage that no plug-in connector is required. Changing the specimen holder is therefore very simple. Furthermore, the identification unit (in this exemplary embodiment designed as a transponder or bar code) makes it possible to uniquely index and identify the different versions of specimen holders. However, if a specimen holder which is not uniquely identifiable or belongs to a manufacturer whose specimen holder should not be used in the transmission electron microscope is to be used, a control electronic system will not enable the specimen holder as well as the transmission electron microscope for use or will enable them only with limitations. Due to the simple identification, it is also possible to adjust, set, and limit if necessary the movement modes of a goniometer, via which a determinable tilt angle of the specimen holder is set, according to the type of specimen holder.

What is claimed is:

1. An electron beam device, comprising:
    at least one specimen holder including at least one holding element for holding a specimen and at least one identification unit;
    a reading unit for reading the identification unit without contact;
    a goniometer which receives the specimen holder; and
    a controller for controlling movement modes of the goniometer, via which the movement modes of the goniometer are controlled on the basis of identification data supplied by the identification unit and of corresponding data stored in the controller.

2. The electron beam device as recited in claim 1, characterized in that the identification unit is an active or a passive unit.

3. The electron beam device as recited in claim 2, characterized in that the identification unit includes at least one of: an optical unit and a magnetic unit.

4. The electron beam device as recited in claim 3, characterized in that the identification unit is readable using at least one of: an optical reading unit and a magnetic reading unit.

5. The electron beam device as recited in claim 4, characterized in that the reading unit includes a laser scanner.

6. The electron beam device as recited in claim 4, characterized in that the identification unit includes a transponder including at least one high-frequency coil.

7. The electron beam device as recited in claim 6, characterized in that the transponder is readable by a reading unit including at least one receiving coil.

8. The electron beam device as recited in claim 4, characterized in that the identification unit includes at least one bar code.

9. The electron beam device as recited in claim 4, characterized in that the specimen holder includes a handle on which the identification unit is situated.

10. The electron beam device as recited in claim 4, further comprising:
    an electronic analyzer system.

11. The electron beam device as recited in claim 4, characterized in that the reading unit is situated in or on the goniometer.

12. The electron beam device as recited in claim 4, characterized in that the data stored in the controller include a plurality of data records specifying movement sequences of a plurality of specimen holders, wherein each data record corresponds to a single specimen holder and is not modifiable.

13. The electron beam device as recited in claim 4, characterized in that the controller is designed as a controller of the electron beam device.

14. The electron beam device as recited in claim 1, characterized in that the identification unit includes at least one of: an optical unit and a magnetic unit.

15. The electron beam device as recited in claim 1, characterized in that the identification unit is readable using at least one of: an optical reading unit and a magnetic reading unit.

16. The electron beam device as recited in claim 15, characterized in that the reading unit includes a laser scanner.

17. The electron beam device as recited in claim 1, characterized in that the identification unit includes a transponder including at least one high-frequency coil.

18. The electron beam device as recited in claim 17, characterized in that the transponder is readable by a reading unit including at least one receiving coil.

19. The electron beam device as recited in claim 1, characterized in that the identification unit includes at least one bar code.

20. The electron beam device as recited in claim 1, characterized in that the specimen holder includes a handle on which the identification unit is situated.

21. The electron beam device as recited in claim 1, further comprising:

an electronic analyzer system.

22. The electron beam device as recited in claim 1, characterized in that the reading unit is situated in or on the goniometer.

23. The electron beam device as recited in claim 1, characterized in that the data stored in the controller include a plurality of data records specifying movement sequences of a plurality of specimen holders, wherein each data record corresponds to a single specimen holder and is not modifiable.

24. The electron beam device as recited in claim 1, characterized in that the controller is designed as a controller of the electron beam device.

* * * * *

UNITED STATES PATENT AND TRADEMARK OFFICE
CERTIFICATE OF CORRECTION

PATENT NO. : 7,119,344 B2
APPLICATION NO. : 10/895629
DATED : October 10, 2006
INVENTOR(S) : Stephan Hiller et al.

It is certified that error appears in the above-identified patent and that said Letters Patent is hereby corrected as shown below:

In claim 3, at col. 4, line 39, replace "claim 2" with --claim 1--.
In claim 4, at col. 4, line 42, replace "claim 3" with --claim 1--.
In claim 6, at col. 4, line 48, replace "claim 4" with --claim 1--.
In claim 8, at col. 4, line 54, replace "claim 4" with --claim 1--.
In claim 9, at col. 4, line 57, replace "claim 4" with --claim 1--.
In claim 10, at col. 4, line 60, replace "claim 4" with --claim 1--.
In claim 11, at col. 4, line 63, replace "claim 4" with --claim 1--.
In claim 12, at col. 4, line 66, replace "claim 4" with --claim 1--.
In claim 13, at col. 5, line 5, replace "claim 4" with --claim 1--.
In claim 14, at col. 5, line 8, replace "claim 1" with --claim 2--.
In claim 15, at col. 5, line 11, replace "claim 1" with --claim 14--.
In claim 17, at col. 5, line 18, replace "claim 1" with --claim 15--.
In claim 19, at col. 6, line 1, replace "claim 1" with --claim 15--.
In claim 20, at col. 6, line 4, replace "claim 1" with --claim 15--.
In claim 21, at col. 6, line 7, replace "claim 1" with --claim 15--.
In claim 22, at col. 6, line 10, replace "claim 1" with --claim 15--.
In claim 23, at col. 6, line 13, replace "claim 1" with --claim 15--.
In claim 24, at col. 6, line 19, replace "claim 1" with --claim 15--.

Signed and Sealed this

Seventh Day of August, 2007

JON W. DUDAS
*Director of the United States Patent and Trademark Office*